US009941377B2

(12) United States Patent
Yang et al.

(10) Patent No.: US 9,941,377 B2
(45) Date of Patent: Apr. 10, 2018

(54) SEMICONDUCTOR DEVICES WITH WIDER FIELD GATES FOR REDUCED GATE RESISTANCE

(71) Applicant: QUALCOMM Incorporated, San Diego, CA (US)

(72) Inventors: Haining Yang, San Diego, CA (US); Xiangdong Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/189,325

(22) Filed: Jun. 22, 2016

(65) Prior Publication Data
US 2017/0186848 A1 Jun. 29, 2017

Related U.S. Application Data

(60) Provisional application No. 62/272,248, filed on Dec. 29, 2015.

(51) Int. Cl.
*H01L 29/49* (2006.01)
*H01L 21/28* (2006.01)
(Continued)

(52) U.S. Cl.
CPC .... *H01L 29/4966* (2013.01); *H01L 21/28088* (2013.01); *H01L 21/823437* (2013.01);
(Continued)

(58) Field of Classification Search
CPC ...................... H01L 29/4966; H01L 29/66845
(Continued)

(56) References Cited

U.S. PATENT DOCUMENTS 6,828,198 B2 12/2004 Su et al.
7,666,743 B2 2/2010 Lee et al.
(Continued)

FOREIGN PATENT DOCUMENTS

EP 0731494 A2 9/1996

OTHER PUBLICATIONS

Chatterjee, A. et al., "A Transistor Performance Figure-of-Merit Including the Effect of Gate Resistance and its Application to Scaling to Sub-0.25-μm CMOS Logic Technologies," IEEE Transactions on Electron Devices, vol. 45, No. 6, Jun. 1998, pp. 1246-1252.

(Continued)

*Primary Examiner* — Moazzam Hossain
*Assistant Examiner* — Warren H Kilpatrick
(74) *Attorney, Agent, or Firm* — Withrow & Terranova, PLLC

(57) ABSTRACT

Semiconductor devices with wider field gates for reduced gate resistance are disclosed. In one aspect, a semiconductor device is provided that employs a gate. The gate is a conductive line disposed above the semiconductor device to form transistors corresponding to active semiconductor regions. Each active semiconductor region has a corresponding channel region. Portions of the gate disposed over each channel region are active gates, and portions not disposed over the channel region, but that are disposed over field oxide regions, are field gates. A voltage differential between each active gate and a source of each corresponding transistor causes current flow in a channel region when the voltage differential exceeds a threshold voltage. The width of each field gate is a larger width than each active gate. The larger width of the field gates results in reduced gate resistance compared to devices with narrower field gates.

16 Claims, 9 Drawing Sheets

(51) Int. Cl.
*H01L 29/66* (2006.01)
*H01L 21/8234* (2006.01)
*H01L 29/423* (2006.01)
*H01L 29/78* (2006.01)

(52) U.S. Cl.
CPC .... *H01L 29/4238* (2013.01); *H01L 29/66545* (2013.01); *H01L 29/78* (2013.01)

(58) Field of Classification Search
USPC .......................................................... 257/407
See application file for complete search history.

(56) References Cited

U.S. PATENT DOCUMENTS

| | | |
|---|---|---|
| 9,070,785 B1 | 6/2015 | Niimi et al. |
| 9,202,914 B2 | 12/2015 | Hou et al. |
| 2005/0205894 A1 | 9/2005 | Sumikawa et al. |
| 2007/0108528 A1* | 5/2007 | Anderson ............... H01L 27/11 257/365 |
| 2008/0179635 A1 | 7/2008 | Gossner |
| 2011/0042750 A1 | 2/2011 | Chuang et al. |
| 2013/0183809 A1 | 7/2013 | Chuang et al. |
| 2013/0299918 A1* | 11/2013 | Kim ........................ H01L 29/78 257/402 |
| 2015/0115373 A1 | 4/2015 | Yu et al. |
| 2015/0228722 A1 | 8/2015 | Chung et al. |

OTHER PUBLICATIONS

Wachnik, R. A. et al., "Gate Stack Resistance and Limits to CMOS Logic Performance," Proceedings of the IEEE 2013 Custom Integrated Circuits Conference, Sep. 22-25, 2013, San Jose, CA, IEEE, 4 pages.

International Search Report and Written Opinion for PCT/US2016/068883, dated Mar. 22, 2017, 16 pages.

International Preliminary Report on Patentability for PCT/US2016/068883, dated Nov. 17, 2017, 18 pages.

* cited by examiner

SEMICONDUCTOR DEVICES WITH WIDER FIELD GATES FOR REDUCED GATE RESISTANCE

PRIORITY CLAIM

The present application claims priority under 35 U.S.C. § 119(e) to U.S. Provisional Patent Application Ser. No. 62/272,248 filed on Dec. 29, 2015 and entitled "SEMICONDUCTOR DEVICES WITH WIDER FIELD GATES FOR REDUCED GATE RESISTANCE," the contents of which is incorporated herein by reference in its entirety.

BACKGROUND

I. Field of the Disclosure

The technology of the disclosure relates generally to semiconductor devices, and particularly to the width of gates employed within semiconductor devices.

II. Background

Transistors are essential components in modern electronic devices. In particular, large numbers of transistors are employed in the design of each component in many modern electronic devices. For example, components such as central processing units (CPUs) and memory systems each employ a large quantity of transistors. In this manner, many electronic devices employ metal-oxide semiconductor (MOS) transistors, such as p-type MOS (PMOS) and n-type MOS (NMOS) transistors. Due to the prevalence of transistors in such components, performance of corresponding electronic devices is partially dependent on particular transistor design properties.

One transistor design property that affects the performance of electronic devices is the channel length of a transistor. For example, in MOS transistors, the channel is the portion of a transistor in which current flows in response to a voltage difference between a gate of the transistor and a source or drain of the transistor. MOS transistors continue to be designed with increasingly smaller channel lengths so as to achieve reduced area consumption. Such reduced area consumption of MOS transistors allows a higher density of MOS transistors to be employed in a particular area. Reduced channel length can also achieve reduced parasitic capacitance. Reduced parasitic capacitance reduces a resistor-capacitor (RC) delay of a MOS transistor, which reduces a signal delay of the MOS transistor. Additionally, reduced channel length can increase drive current (i.e., drive strength) corresponding to MOS transistors, because a reduced channel length reduces trap current associated with a capacitance between a gate and a channel region. An increased drive current can increase a switching speed of a MOS transistor, because the increased drive current can increase the rate at which the gate to source voltage ramps up to a threshold voltage of the MOS transistor.

However, as the channel length of MOS transistors decreases, the width of a corresponding gate is conventionally decreased to correspond to the reduced scaling achieved with the reduction in channel length. Because a gate is formed from a conductive material, a reduced gate width increases the resistance associated with the gate (i.e., gate resistance), as the resistance of a conductive material is inversely proportional to the conductive area of the conductive material. Increased gate resistance increases the RC delay of the corresponding MOS transistor. An increase in the RC delay of a MOS transistor causes the MOS transistor to switch more slowly, which, in turn, reduces the performance of the MOS transistor.

In this regard, it would be advantageous to employ transistors with reduced channel lengths for reduced area consumption, increased drive current, and reduced parasitic capacitance, while reducing or avoiding an increase in RC delay.

SUMMARY OF THE DISCLOSURE

Aspects disclosed herein include semiconductor devices with wider field gates for reduced gate resistance. In one aspect, a semiconductor device is provided that employs a gate. The gate is an elongated conductive line disposed above the semiconductor device so as to form transistors corresponding to active semiconductor regions of the semiconductor device. Each active semiconductor region in the semiconductor device has a corresponding channel region. The portions of the gate that are disposed over a top surface of a corresponding active semiconductor region and the corresponding channel region are referred to as active gate regions (i.e., active gates). The portions of the gate not disposed in this manner, but that are instead disposed over a top surface of a field oxide region, are referred to as field gate regions (i.e., field gates). The gate is designed to receive a voltage, wherein a voltage differential between each active gate and a source of each corresponding transistor causes a current to flow in the corresponding channel region when the voltage differential exceeds a corresponding threshold voltage. Additionally, each field gate is employed to electrically couple each active gate to other elements in the gate, such as other active gates. Thus, the width of each field gate is not limited by the channel length, which enables each field gate to have a width that is larger than a width of each active gate. Further, the gate is made partially from a conductive material, and thus, the larger width of the field gates results in a reduced gate resistance compared to devices with narrower field gates. A reduced gate resistance reduces a resistor-capacitor (RC) delay of the gate, which allows the semiconductor device to mitigate increases in RC delay caused by employing a smaller channel length.

In this regard in one aspect, a semiconductor device is provided. The semiconductor device comprises one or more active semiconductor regions, each comprising a corresponding channel region having a channel length. The semiconductor device further comprises a gate. The gate comprises one or more field gates, each disposed over a top surface of a corresponding field oxide region, wherein each field gate has a first width. The gate further comprises one or more active gates, each disposed over a top surface of a corresponding active semiconductor region and the corresponding channel region. At least one of the one or more active gates has a second width less than the first width.

In another aspect, a semiconductor device is provided. The semiconductor device comprises a means for providing one or more active semiconductor regions, each comprising a corresponding channel region having a channel length. The semiconductor device further comprises a means for providing one or more field oxide regions. The semiconductor device further comprises a means for providing voltage to the semiconductor device. The means for providing voltage comprises a means for transferring current. The means for transferring current is disposed over a top surface of a corresponding field oxide region and has a first width. The means for providing voltage further comprises a means for receiving current disposed over a top surface of a corresponding active semiconductor region and the corresponding channel region. The means for receiving current has a second width less than the first width.

In another aspect, a method of manufacturing a semiconductor device is provided. The method comprises disposing an insulator layer on a top surface of one or more active semiconductor regions and a top surface of one or more field oxide regions of a substrate. The method further comprises disposing a polysilicon layer on the insulator layer. The method further comprises disposing an oxide hard mask layer on the polysilicon layer. The method further comprises etching the oxide hard mask layer and the polysilicon layer such that the oxide hard mask layer and the polysilicon layer have a first width. The method further comprises etching the oxide hard mask layer and the polysilicon layer corresponding to the one or more active semiconductor regions to a second width that is less than the first width. The method further comprises forming a first spacer on a first side of the polysilicon layer and a second spacer on a second side of the polysilicon layer. The method further comprises removing the oxide hard mask layer to expose the polysilicon layer. The method further comprises removing the polysilicon layer. The method further comprises disposing a dielectric layer between the first spacer and the second spacer. The method further comprises disposing a work function layer on the dielectric layer. The method further comprises disposing a conductive layer on the work function layer to form a gate comprising one or more field gates and one or more active gates.

DETAILED DESCRIPTION

With reference now to the figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include semiconductor devices with wider field gates for reduced gate resistance. In one aspect, a semiconductor device is provided that employs a gate. The gate is an elongated conductive line disposed above the semiconductor device so as to form transistors corresponding to active semiconductor regions of the semiconductor device. Each active semiconductor region in the semiconductor device has a corresponding channel region. The portions of the gate that are disposed over a top surface of a corresponding active semiconductor region and the corresponding channel region are referred to as active gate regions (i.e., active gates). The portions of the gate not disposed in this manner, but that are instead disposed over a top surface of a field oxide region are referred to as field gate regions (i.e., field gates). The gate is designed to receive a voltage, wherein a voltage differential between each active gate and a source of each corresponding transistor causes a current to flow in the corresponding channel region when the voltage differential exceeds a corresponding threshold voltage. Additionally, each field gate is employed to electrically couple each active gate to other elements in the gate, such as other active gates. Thus, the width of each field gate is not limited by the channel length, which enables each field gate to have a width that is larger than a width of each active gate. Further, the gate is made partially from a conductive material, and thus, the larger width of the field gates results in a reduced gate resistance compared to devices with narrower field gates. A reduced gate resistance reduces a resistor-capacitor (RC) delay of the gate, which allows the semiconductor device to mitigate increases in RC delay caused by employing a smaller channel length.

Figure 1:
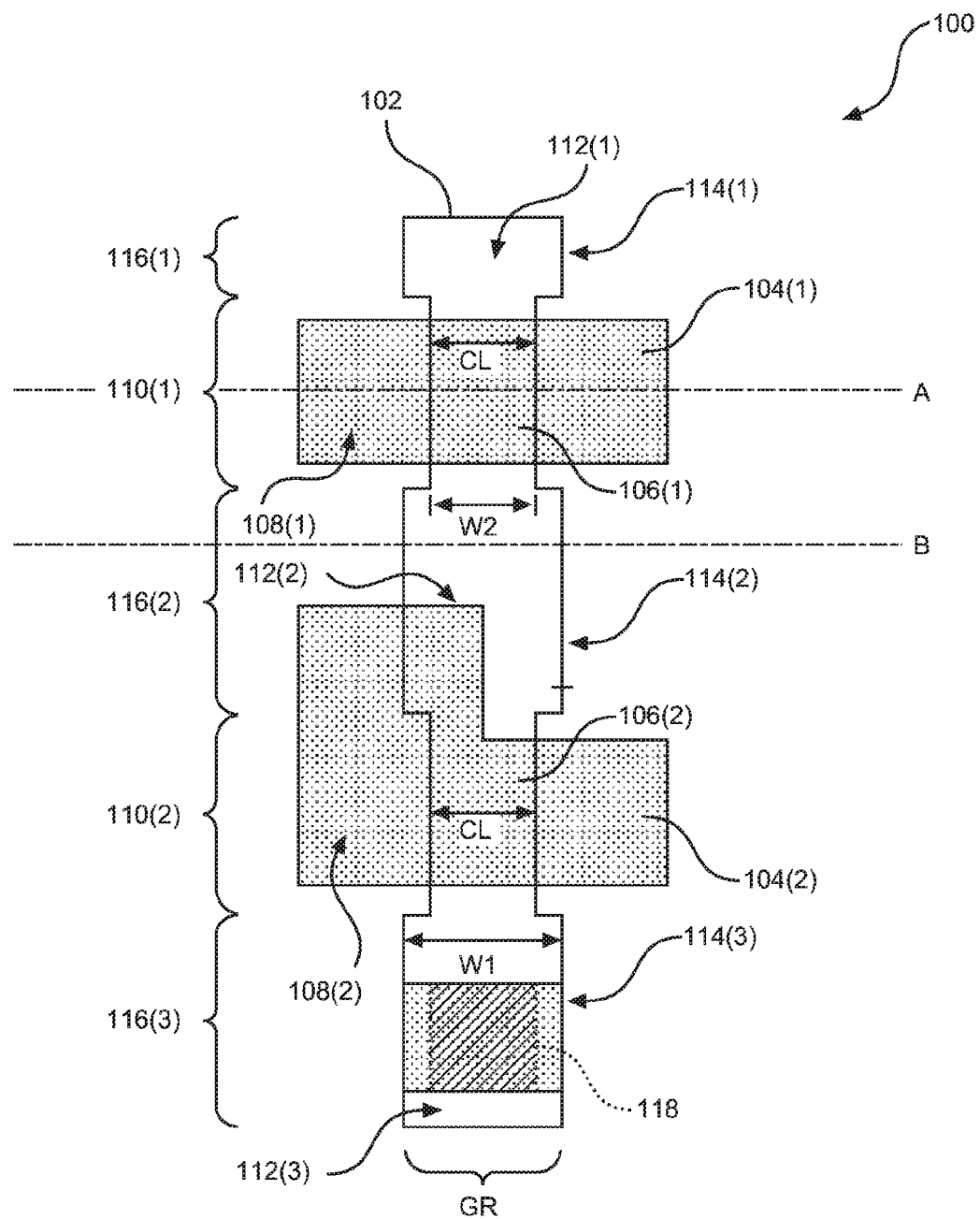
FIG. 1 is a diagram of an exemplary semiconductor device employing a gate with field gates of a first width and active gates of a second width less than the first width to achieve reduced gate resistance.

In this regard, FIG. 1 illustrates an exemplary semiconductor device 100 employing a gate 102. The gate 102 is an elongated conductive line disposed in the semiconductor device 100 so as to form transistors corresponding to active semiconductor regions 104(1), 104(2) of the semiconductor device 100. Each active semiconductor region 104(1), 104(2) has a corresponding channel region 106(1), 106(2) having a corresponding channel length CL. The portions of the gate 102 disposed over a top surface 108(1), 108(2) of a corresponding active semiconductor region 104(1), 104(2) and the corresponding channel region 106(1), 106(2) are referred to as active gate regions 110(1), 110(2) (i.e., active gates 110(1), 110(2)). The portions of the gate 102 not disposed in this manner, but that are instead disposed over a top surface 112(1)-112(3) of a corresponding field oxide region 114(1)-114(3) are referred to as field gate regions 116(1)-116(3) (i.e., field gates 116(1)-116(3)). The active gates 110(1), 110(2) and the field gates 116(1)-116(3) are all disposed such that the gate 102 is formed as the elongated conductive line. Further, a gate contact 118 is disposed on the field gate 116(3) and is configured to receive a voltage for the gate 102 from a voltage source (not shown), for example. In this manner, in response to the gate 102 receiving a voltage via the gate contact 118, a voltage differential between each active gate 110(1), 110(2) and a source of each corresponding transistor causes a current to flow in the corresponding channel region 106(1), 106(2) when the voltage differential exceeds a corresponding threshold voltage.

With continuing reference to FIG. 1, while each active gate 110(1), 110(2) is configured to cause current to flow in the corresponding channel region 106(1), 106(2), each field gate 116(1)-116(3) is configured to electrically couple the active gates 110(1), 110(2) to other elements of the gate 102. For example, the field gate 116(2) is configured to electrically couple the active gate 110(1) to the active gate 110(2), and the field gate 116(3) is configured to electrically couple the active gate 110(2) to the gate contact 118. In this manner, each field gate 116(1)-116(3) is disposed over the field oxide region 114(1)-114(3) instead of over the active semiconductor region 104(1), 104(2) and the corresponding channel region 106(1), 106(2). Because each field gate 116(1)-116(3) is configured to electrically couple such elements rather than cause current to flow in the channel regions 106(1), 106(2) and is disposed over the corresponding field oxide region 114(1)-114(3), each field gate 116(1)-116(3) has a first width W1 that is not limited by the channel length CL. Conversely, because the active gates 110(1), 110(2) are configured to cause current to flow as described above, each active gate 110(1), 110(2) is limited by the channel length CL, and has a second width W2 that is less than the first width W1. In this aspect, the second width W2 is approximately equal to the channel length CL. As a non-limiting example, in a transistor designed with a channel length CL of twenty (20) nanometers (nm), the first width W1 is approximately equal to twenty-four (24) nm, while the second width W2 is approximately equal to 20 nm.

With continuing reference to FIG. 1, the gate 102 includes a conductive layer formed from a conductive material, such as, but not limited to, tungsten, aluminum, or cobalt. The resistance R of a conductive material is inversely proportional to the conductive area A of the conductive material (i.e., R=1/A). Thus, the larger first width W1 of the field gates 116(1)-116(3) results in the field gates 116(1)-116(3) having a smaller resistance R compared to the active gates 110(1), 110(2). The smaller resistance R of the field gates 116(1)-116(3) results in a reduced gate resistance GR compared to devices with narrower field gates. A reduced gate resistance GR reduces a resistor-capacitor (RC) delay of the gate 102. This allows the semiconductor device 100 to mitigate increases in RC delay caused by the narrower second width W2 of the active gates 110(1), 110(2) resulting from the channel regions 106(1), 106(2) with smaller channel lengths. Therefore, the semiconductor device 100 may reduce or avoid increases in gate resistance GR, and thus, mitigate increases in RC delay caused by employing a smaller channel length CL.

Additionally, employing the field gates 116(1)-116(3) with the first width W1 in this manner also reduces variation of resistance R in the field gates 116(1)-116(3) across multiple instances of the gate 102 in a circuit. For example, the field gates 116(1)-116(3) across multiple instances of the gate 102 can be designed to have the first width W1 (e.g., 24 nm) instead of having a variation of the first and second widths W1, W2 (e.g., 24 nm, 20 nm), thus causing the field gates 116(1)-116(3) to have a similar resistance R. Reducing the variation of resistance R in this manner can improve the corner performance of a circuit employing the gate 102. More specifically, the corner performance of a circuit corresponds to an instance of the gate 102 having the smallest area of the multiple instances of the gate 102 in the circuit, as that instance of the gate 102 has the highest gate resistance GR. The smaller area and higher gate resistance GR of the gate 102 makes it more sensitive to changes in resistance R, and thus, the instance of the gate 102 corresponding to the corner performance particularly benefits from the reduced gate resistance GR corresponding to the field gates 116(1)-116(3) with the first width W1.

With continuing reference to FIG. 1, the gate contact 118 is formed from a conductive material, which also contributes to the overall gate resistance GR. Thus, increasing the area of the gate contact 118 reduces the resistance R attributable to the gate contact 118, which further reduces the overall gate resistance GR. However, the gate contact 118 should be designed with an area that avoids creating an electrical short with other gates in a corresponding circuit. For example, the gate contact 118 can be designed with a width equal to the second width W2 if other design considerations suggest such a contact size. On the other hand, the gate contact 118 can be designed with a width equal to the first width W1 to reduce the corresponding resistance R if the first width W1 does not cause an electrical short with another gate. Increasing the size of the gate contact 118 in this manner reduces the overall gate resistance GR, and thus, further mitigates increases in RC delay caused by a smaller channel CL.

Figure 2:
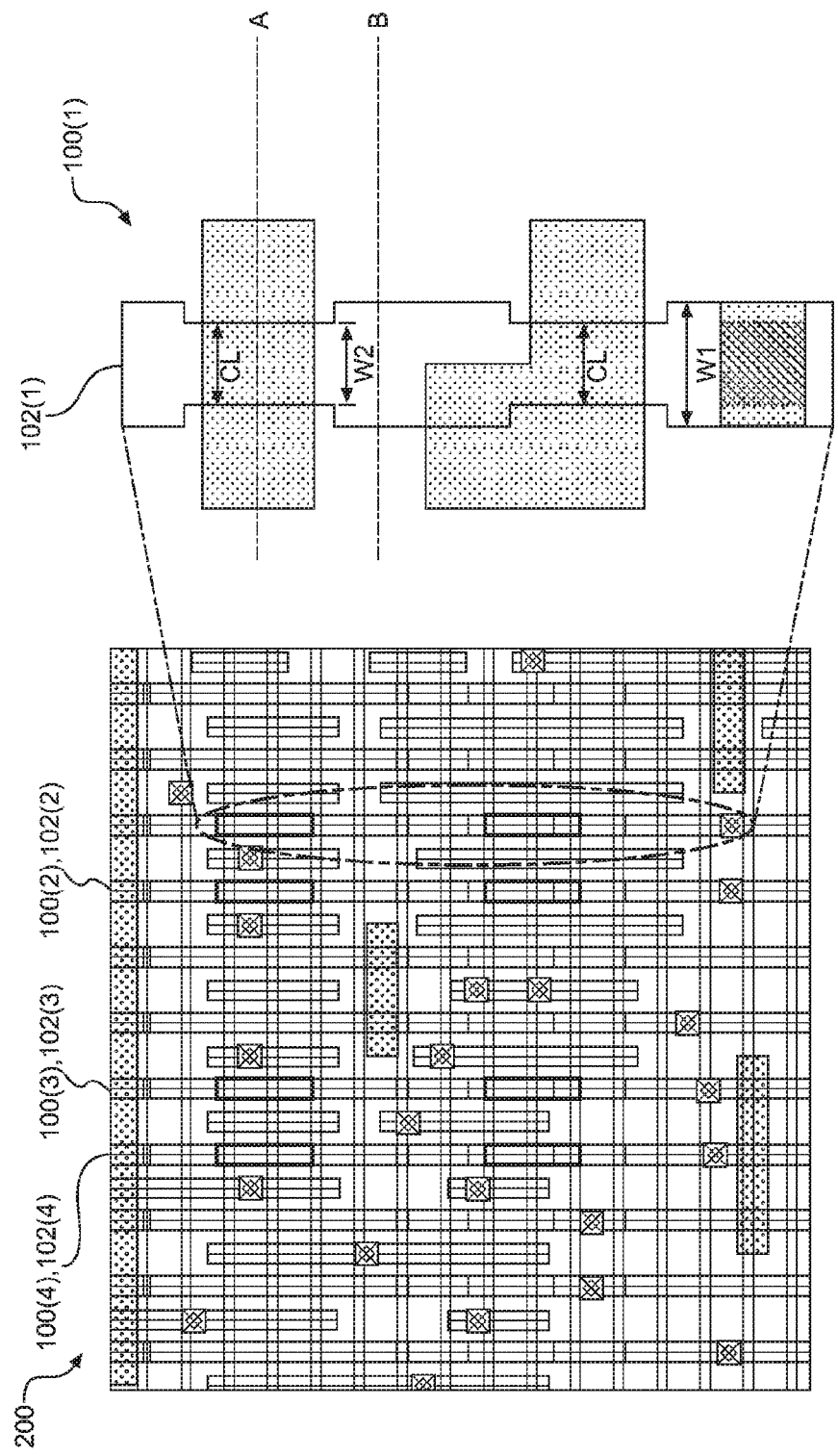
FIG. 2 is a diagram of an exemplary integrated circuit (IC) that employs multiple instances of the semiconductor device in FIG. 1 to reduce resistance of the IC.

FIG. 2 illustrates an exemplary integrated circuit (IC) 200 that employs multiple instances of the semiconductor device 100(1)-100(4). As described above, each instance of the semiconductor device 100(1)-100(4) provides reduced gate resistance GR, which mitigates corresponding increases in RC delay caused by a smaller channel length CL for each gate 102(1)-102(4). Thus, the semiconductor devices 100(1)-100(4) can be used to mitigate multiple increases in RC delay, which increases the performance of the entire IC 200.

Figure 3:
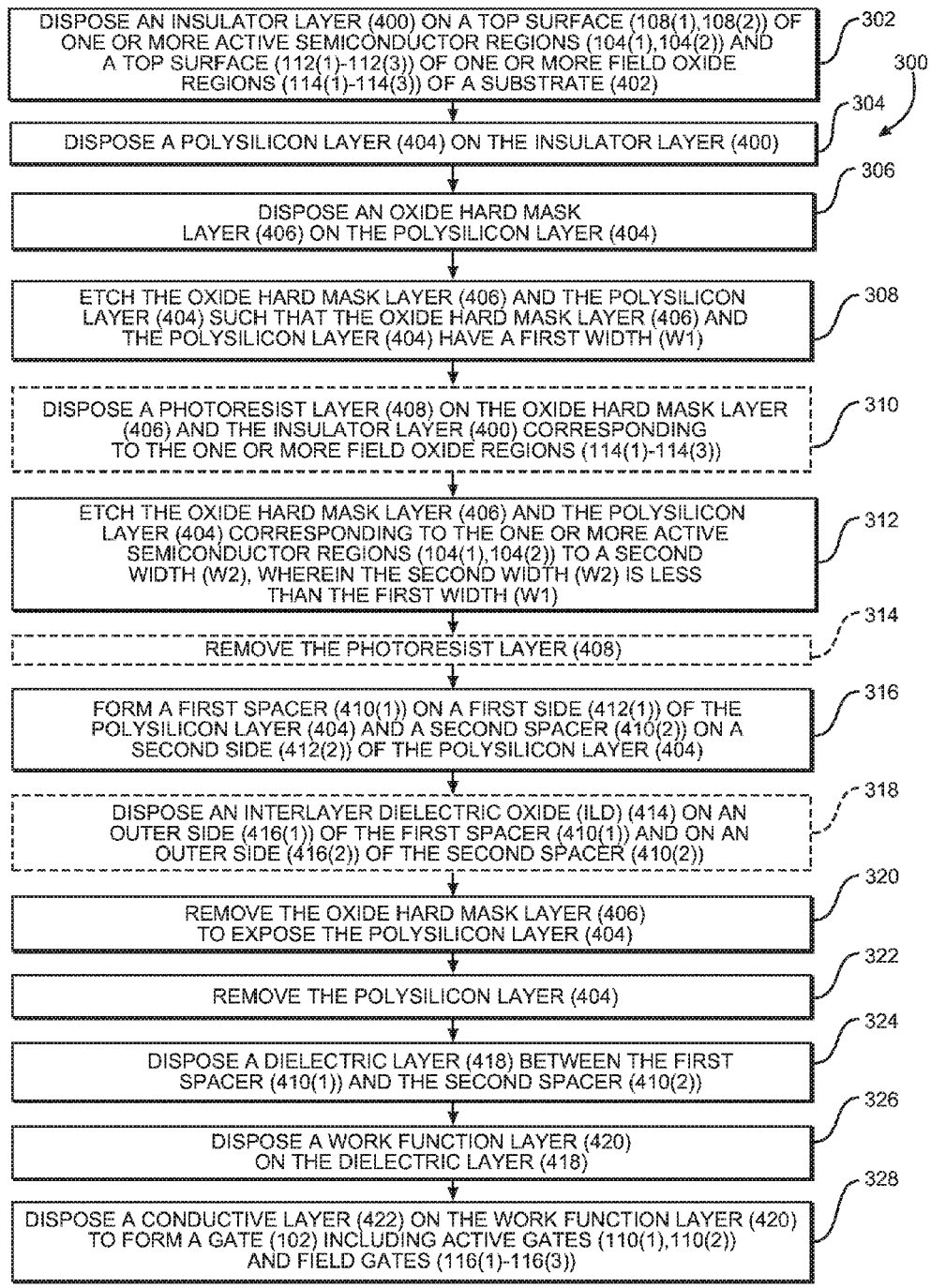
FIG. 3 is a flowchart illustrating a process of manufacturing the semiconductor device in FIG. 1.

In this regard, FIG. 3 illustrates an exemplary process 300 employed to manufacture the semiconductor device 100 in FIG. 1. Further, FIGS. 4A-4I provide cross-sectional diagrams illustrating the active gate 110(1), labeled as 'A,' and the field gate 116(2), labeled as 'B,' of the semiconductor device 100 in FIG. 1 during the steps of the process 300.

Figure 4A:
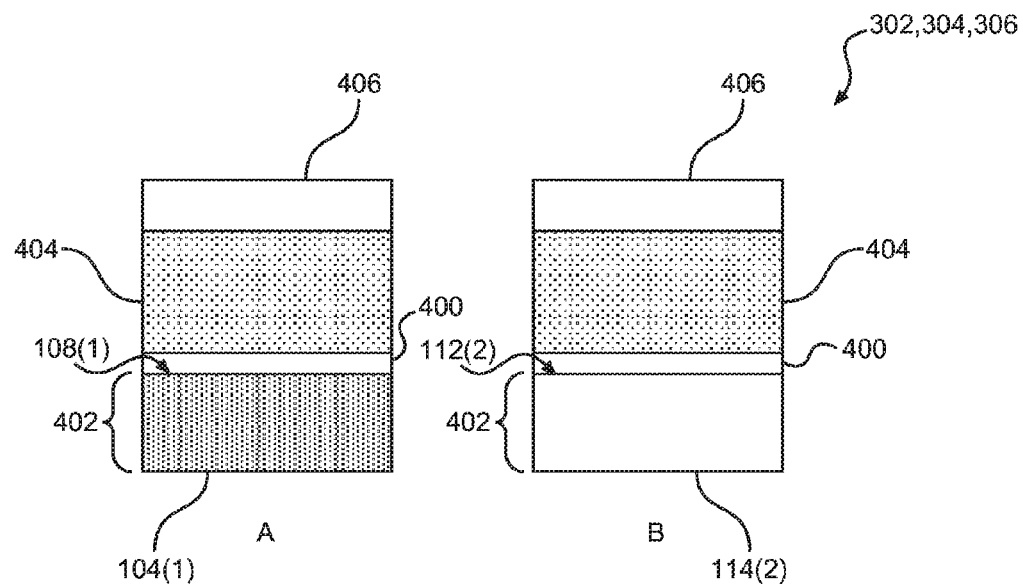
FIGS. 4A-4I are cross-sectional diagrams that illustrate the semiconductor device in FIG. 1 at each step of manufacturing in the process of manufacturing in FIG. 3.
Figure 4B:
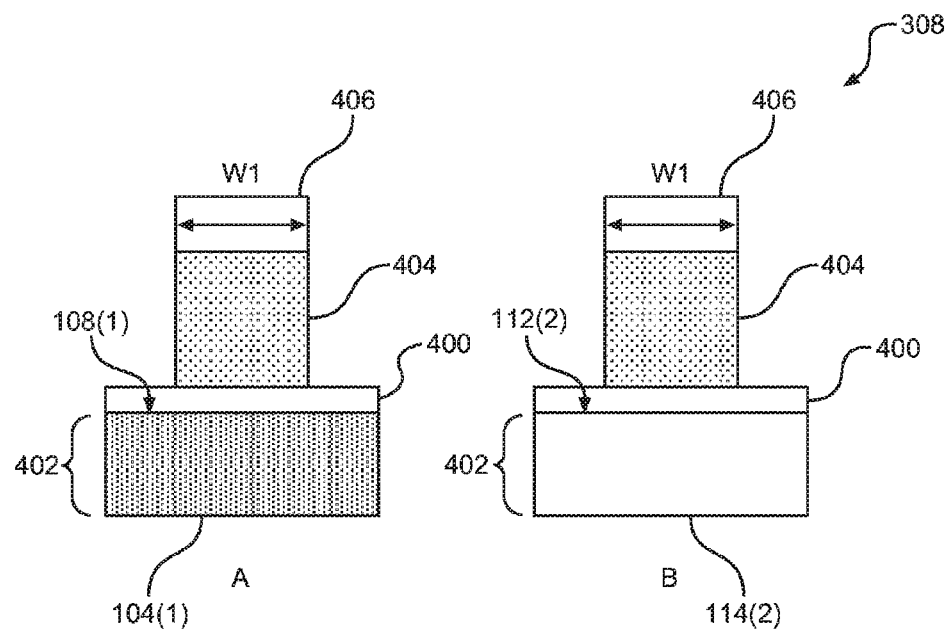
Figure 4C:
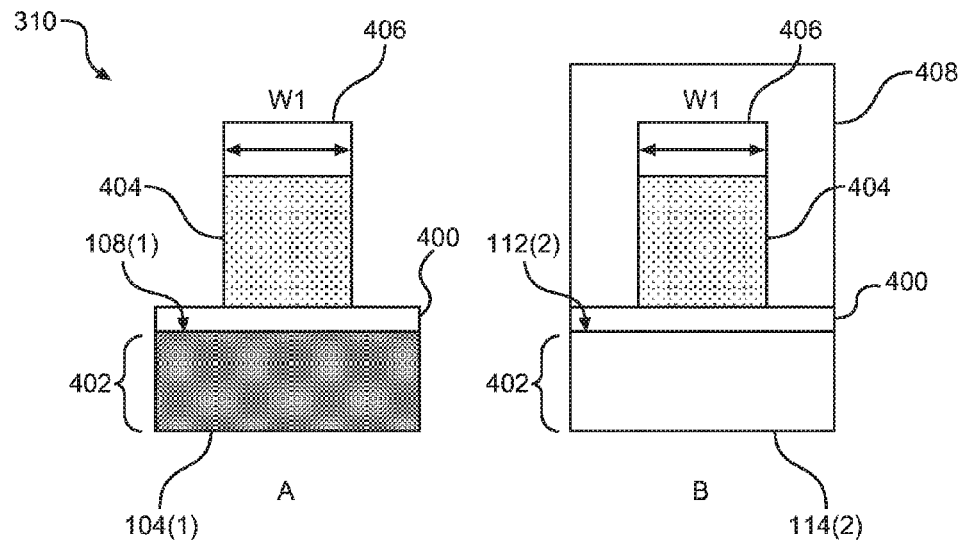
Figure 4D:
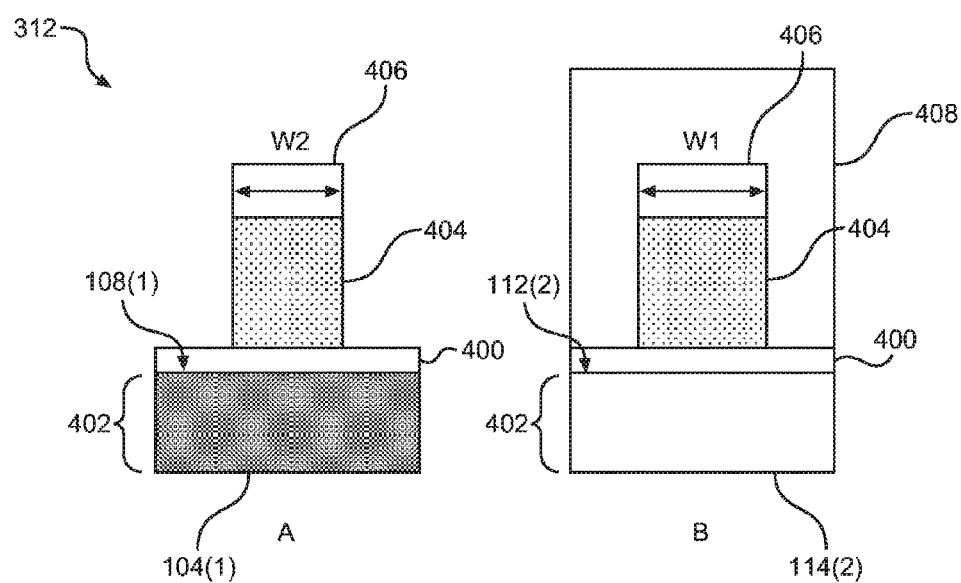

With continuing reference to FIG. 3, the process 300 includes disposing an insulator layer 400 on the top surface 108(1), 108(2) of each corresponding active semiconductor region 104(1), 104(2) and the top surface 112(1)-112(3) of each corresponding field oxide regions 114(1)-114(3) of a substrate 402 (block 302 and FIG. 4A). The process 300 also includes disposing a polysilicon layer 404 on the insulator layer 400 (block 304 and FIG. 4A). The process 300 also includes disposing an oxide hard mask layer 406 on the polysilicon layer 404 (block 306 and FIG. 4A). Further, the process 300 includes etching the oxide hard mask layer 406 and the polysilicon layer 404 such that the oxide hard mask layer 406 and the polysilicon layer 404 have the first width W1 (block 308 and FIG. 4B). The process 300 can also include disposing a photoresist layer 408 on the oxide hard mask layer 406 and the insulator layer 400 corresponding to the field oxide regions 114(1)-114(3) (block 310 and FIG. 4C). The process 300 further includes etching the oxide hard mask layer 406 and the polysilicon layer 404 corresponding to the active semiconductor regions 104(1), 104(2) to the second width W2 (block 312 and FIG. 4D). As previously described, the second width W2 is less than the first width W1, and the second width W2 is approximately equal to the channel length CL. As a non-limiting example, in a transistor designed with a channel length CL of 20 nm, the first width W1 is approximately equal to 24 nm, while the second width W2 is approximately equal to 20 nm.

Figure 4E:
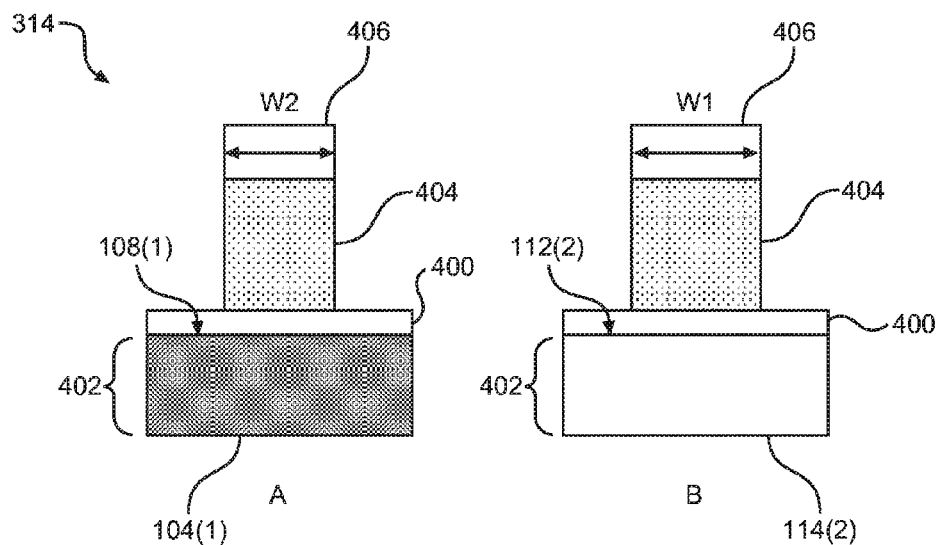
Figure 4F:
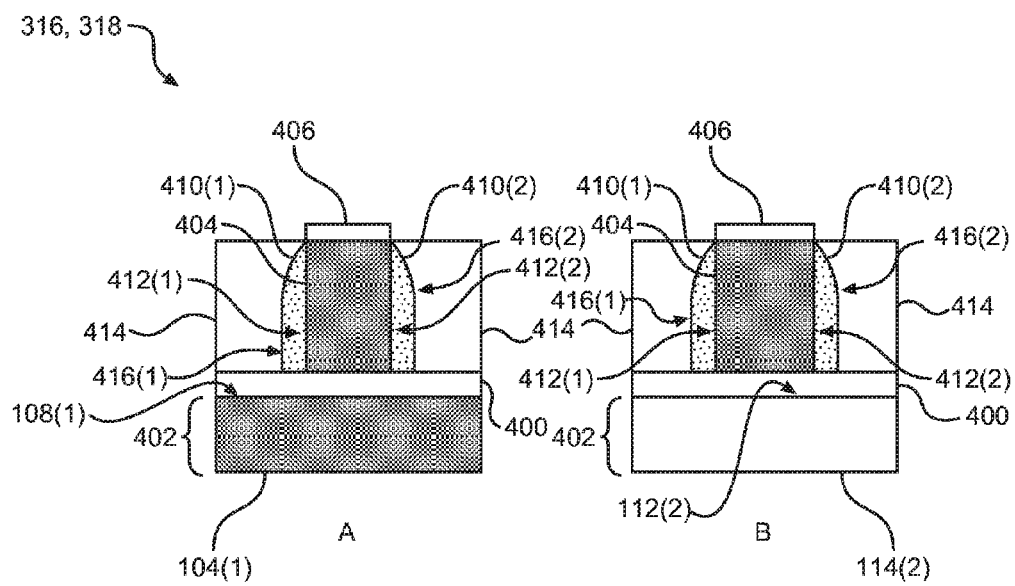
Figure 4G:
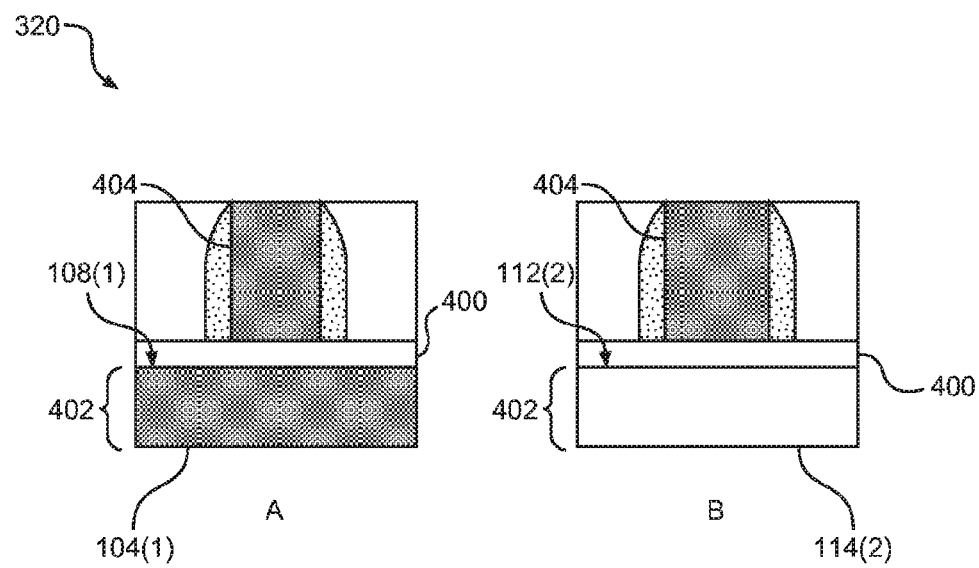
Figure 4H:
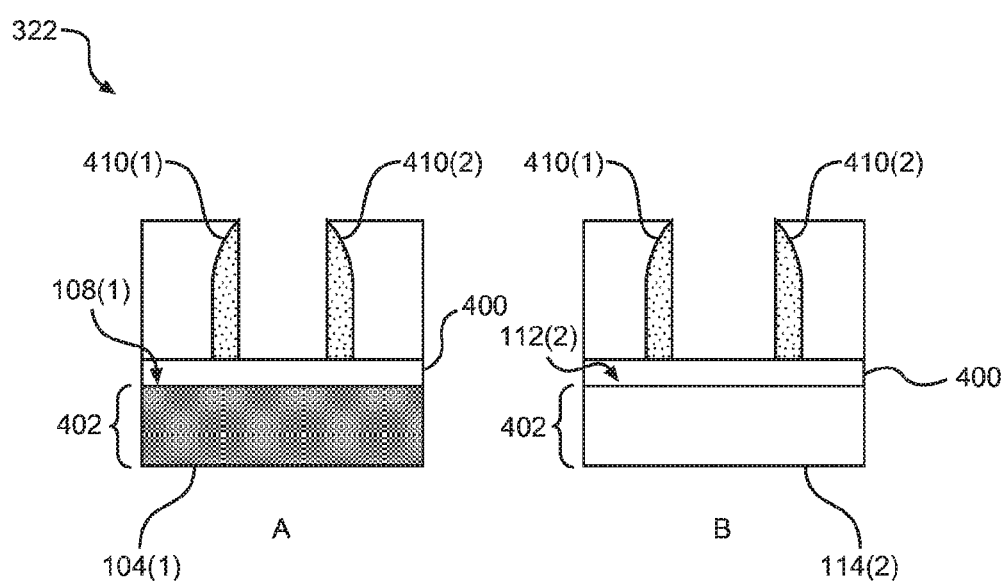

With continuing reference to FIG. 3 and FIGS. 4A-4I, if the process 300 includes disposing the photoresist layer 408 in block 310, the process 300 can also include removing the photoresist layer 408 (block 314 and FIG. 4E). Additionally, the process 300 includes forming a first spacer 410(1) on a first side 412(1) of the polysilicon layer 404 and a second spacer 410(2) on a second side 412(2) of the polysilicon layer 404 (block 316 and FIG. 4F). The process 300 can further include disposing an interlayer dielectric oxide (ILD) 414 on an outer side 416(1) of the first spacer 410(1) and on an outer side 416(2) of the second spacer 410(2) (block 318 in FIG. 4F). The process 300 also includes removing the oxide hard mask layer 406 to expose the polysilicon layer 404 (block 320 and FIG. 4G). In this aspect, removing the oxide hard mask layer 406 can include planarizing the oxide hard mask layer 406 using chemical mechanical polishing (CMP). The process 300 also includes removing the polysilicon layer 404 (block 322 and FIG. 4H). The process 300 also includes disposing a dielectric layer 418 between the first spacer 410(1) and the second spacer 410(2) (block 324 and FIG. 4I). In this aspect, the dielectric layer 418 is formed from a high K dielectric material, such as hafnium oxide (HfOx). The process 300 further includes disposing a work function layer 420 on the dielectric layer 418 (block 326 and FIG. 4I). The work function layer 420 can include materials such as titanium nitride (TiN) or titanium aluminum nitride (TiAN).

Figure 4I:
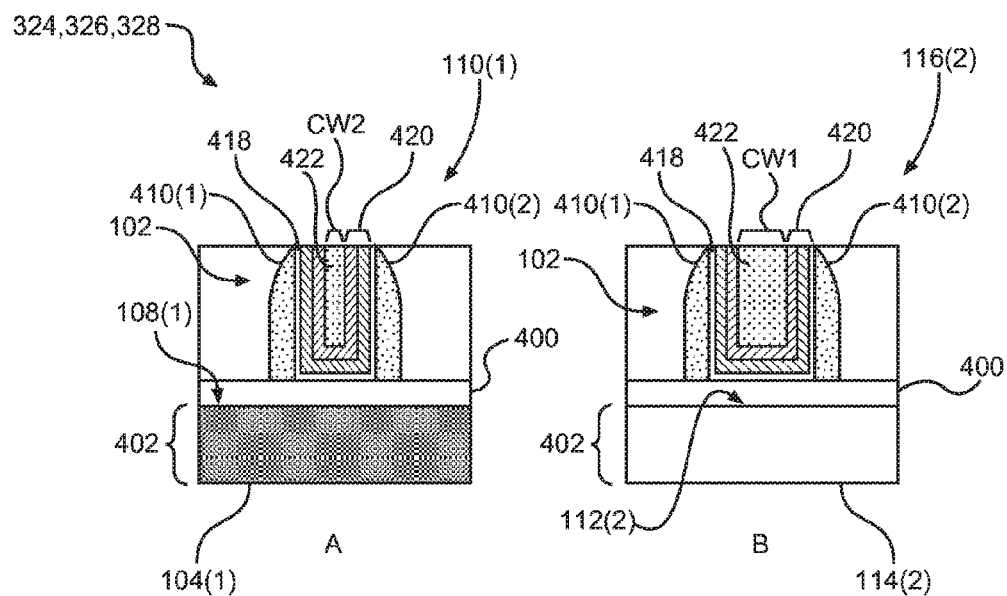

With continuing reference to FIG. 3, the process 300 also includes disposing a conductive layer 422 on the work function layer 420 to form the gate 102 including the active gates 110(1), 110(2) and the field gates 116(1)-116(3) (block 328 and FIG. 4I). Additionally, although not illustrated, the process 300 can further include disposing the gate contact 118 on the field gate 116(3). As illustrated in FIG. 4I, the conductive layer 422 corresponding to the field gates 116(1)-116(3) has a first conductive width CW1. Alternatively, the conductive layer 422 corresponding to the active gates 110(1), 110(2) has a second conductive width CW2 that is less than the first conductive width CW1. Employing the conductive layer 422 in this manner causes the field gates 116(1)-116(3) to have a greater conductive area than the active gates 110(1), 110(2), and thus, a reduced resistance R, as described above. Thus, manufacturing the semiconductor device 100 in FIG. 1 using the process 300 in FIG. 3 allows the semiconductor device 100 to achieve a reduced gate resistance GR, which mitigates increases in the RC delay of the gate 102 caused by a smaller channel length CL. Therefore, the semiconductor device 100 may reduce or avoid increases in RC delay even when employing a smaller channel length CL. Additionally, because some circuits already include semiconductor devices with gate widths of either the first or second widths W1, W2, the process 300 can be used to manufacture the semiconductor device 100 without employing additional masks not already used in the circuit design.

The elements described herein are sometimes referred to as means for achieving a particular property. In this regard, the active semiconductor regions 104(1), 104(2) are sometimes referred to herein as "a means for providing one or more active semiconductor regions, each comprising a corresponding channel region having a channel length." The field oxide regions 114(1)-114(3) are sometimes referred to herein as "a means for providing one or more field oxide regions." The gate 102 is sometimes referred to herein as "a means for providing voltage to the semiconductor device." The field gates 116(1)-116(3) are sometimes referred to herein as "a means for transferring current disposed over a top surface of a corresponding field oxide region, wherein the means for transferring current has a first width." The active gates 110(1), 110(2) are sometimes referred to herein as "a means for receiving current disposed over a top surface of a corresponding active semiconductor region and the corresponding channel region, wherein the means for receiving current has a second width less than the first width."

Semiconductor devices with wider field gates for reduced gate resistance according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a server, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Additionally, the semiconductor device employing a gate with field gates of a first width and active gates of a second width less than the first width to achieve reduced gate resistance as disclosed herein can correspond to various types of transistors. As non-limiting examples, the semiconductor device may correspond to a planar field effect transistor (FET) or a FinFET.

Figure 5:
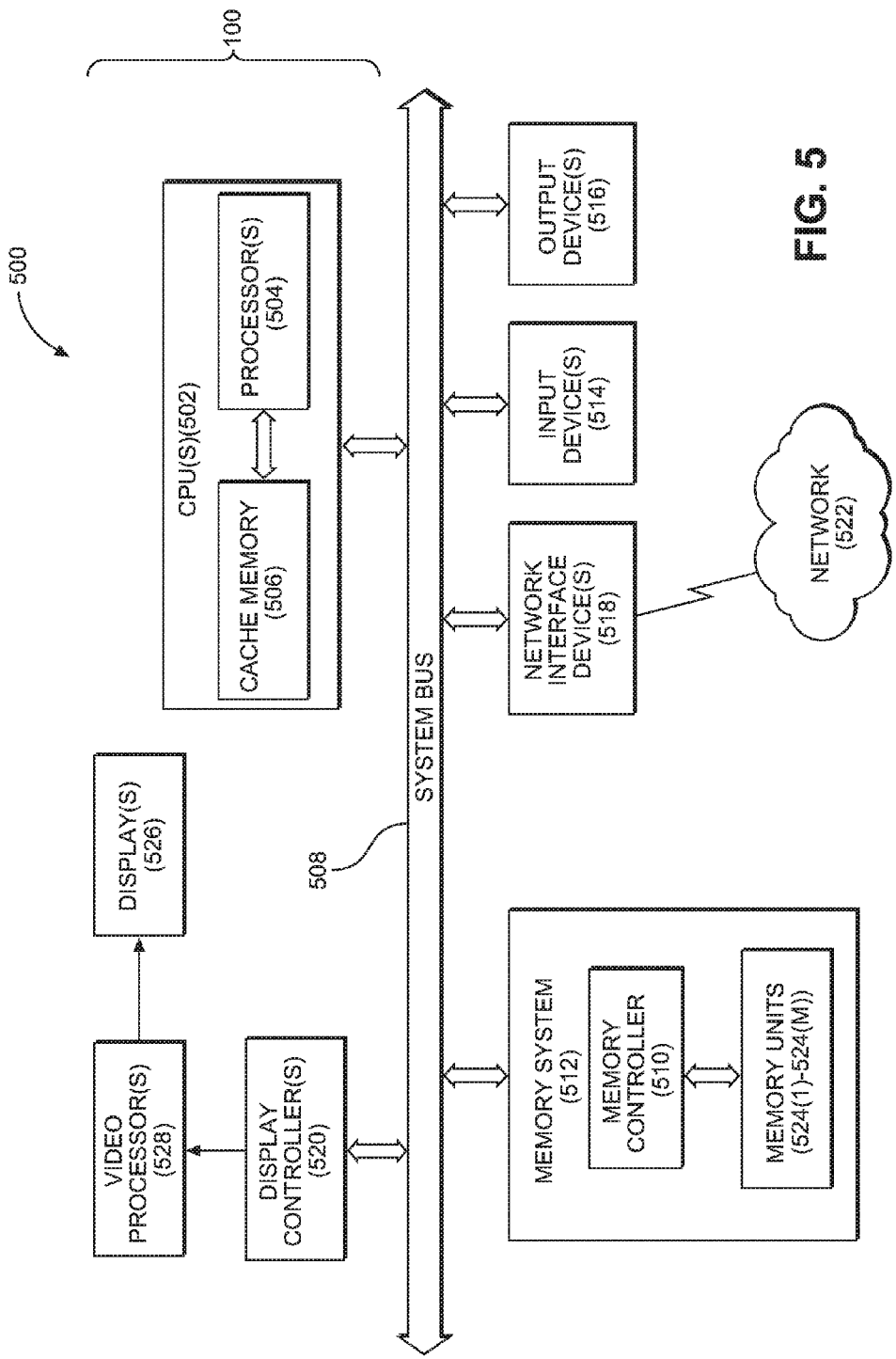
FIG. 5 is a block diagram of an exemplary processor-based system that can include elements that use the semiconductor device employing the gate with field gates of the first width and active gates of the second width less than the first width in FIG. 1 to achieve reduced gate resistance.

In this regard, FIG. 5 illustrates an example of a processor-based system 500 that can employ components that include the semiconductor device 100 illustrated in FIG. 1. In this example, the processor-based system 500 includes one or more central processing units (CPUs) 502, each including one or more processors 504. The CPU(s) 502 may have cache memory 506 coupled to the processor(s) 504 for rapid access to temporarily stored data. The CPU(s) 502 is coupled to a system bus 508 and can intercouple master and slave devices included in the processor-based system 500. As is well known, the CPU(s) 502 communicates with these other devices by exchanging address, control, and data information over the system bus 508. For example, the CPU(s) 502 can communicate bus transaction requests to a memory controller 510 as an example of a slave device. Although not illustrated in FIG. 5, multiple system buses 508 could be provided, wherein each system bus 508 constitutes a different fabric.

Other master and slave devices can be connected to the system bus 508. As illustrated in FIG. 5, these devices can include a memory system 512, one or more input devices 514, one or more output devices 516, one or more network interface devices 518, and one or more display controllers 520, as examples. The input device(s) 514 can include any type of input device, including but not limited to input keys, switches, voice processors, etc. The output device(s) 516 can include any type of output device, including but not limited to audio, video, other visual indicators, etc. The network interface device(s) 518 can be any device configured to allow exchange of data to and from a network 522. The network 522 can be any type of network, including but not limited to a wired or wireless network, a private or public network, a local area network (LAN), a wireless local area network (WLAN), a wide area network (WAN), a BLUETOOTH™ network, or the Internet. The network interface device(s) 518 can be configured to support any type of communications protocol desired. The memory system 512 can include one or more memory units 524(1)-524(M).

The CPU(s) 502 may also be configured to access the display controller(s) 520 over the system bus 508 to control information sent to one or more displays 526. The display controller(s) 520 sends information to the display(s) 526 to be displayed via one or more video processors 528, which process the information to be displayed into a format suitable for the display(s) 526. The display(s) 526 can include any type of display, including but not limited to a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A semiconductor device, comprising:
   one or more active semiconductor regions, each comprising a corresponding channel region having a channel length; and
   a gate, comprising:
      one or more field gates, each disposed over a top surface of a corresponding field oxide region, wherein each field gate has a first width; and
      one or more active gates, each disposed over a top surface of a corresponding active semiconductor region and the corresponding channel region, wherein at least one of the one or more active gates has a second width less than the first width.

2. The semiconductor device of claim 1, wherein the second width of the one or more active gates is approximately equal to the channel length.

3. The semiconductor device of claim 1, further comprising a gate contact disposed on a corresponding field gate.

4. The semiconductor device of claim 3, wherein each field gate electrically couples a corresponding active gate to one of another active gate and the gate contact.

5. The semiconductor device of claim 1, wherein the one or more field gates and the one or more active gates are disposed such that the gate is formed as an elongated conductive line.

6. The semiconductor device of claim 1, wherein:
   each field gate of the one or more field gates comprises:
      a dielectric layer;
      a work function layer disposed on the dielectric layer; and
      a conductive layer disposed on the work function layer, wherein the conductive layer has a first conductive width; and
   each active gate of the one or more active gates comprises:
      the dielectric layer;
      the work function layer disposed on the dielectric layer; and
      the conductive layer having a second conductive width less than the first conductive width.

7. The semiconductor device of claim 6, wherein the conductive layer comprises a material selected from the group consisting of tungsten, aluminum, and cobalt.

8. The semiconductor device of claim 1, wherein:
   the first width is approximately equal to twenty-four nanometers (24 nm); and
   the second width is approximately equal to twenty nanometers (20 nm).

9. The semiconductor device of claim 1 integrated into an integrated circuit (IC).

10. The semiconductor device of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a server; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

11. A semiconductor device, comprising:
a means for providing one or more active semiconductor regions, each comprising a corresponding channel region having a channel length;
a means for providing one or more field oxide regions; and
a means for providing voltage to the semiconductor device, comprising:
  a means for transferring current disposed over a top surface of a corresponding field oxide region, wherein the means for transferring current has a first width; and
  a means for receiving current disposed over a top surface of a corresponding active semiconductor region and the corresponding channel region, wherein the means for receiving current has a second width less than the first width.

12. The semiconductor device of claim 11, wherein the second width is approximately equal to the channel length.

13. The semiconductor device of claim 11, further comprising a means for coupling the means for providing voltage to a voltage source, wherein the means for coupling is disposed on the means for transferring current.

14. The semiconductor device of claim 13, wherein the means for coupling has a width approximately equal to the first width.

15. The semiconductor device of claim 11, wherein:
the first width is approximately equal to twenty-four nanometers (24 nm); and
the second width is approximately equal to twenty nanometers (20 nm).

16. A semiconductor device, comprising:
one or more active semiconductor regions, each comprising a corresponding channel region having a channel length;
a gate, comprising:
  one or more field gates, each disposed over a top surface of a corresponding field oxide region, wherein each field gate has a first width; and
  one or more active gates, each disposed over a top surface of a corresponding active semiconductor region and the corresponding channel region, wherein at least one of the one or more active gates has a second width less than the first width; and
a gate contact disposed on a corresponding field gate, wherein the gate contact has a width approximately equal to the first width.

* * * * *